United States Patent

Hatsukano

[11] 3,965,369
[45] June 22, 1976

[54] MISFET (METAL-INSULATOR-SEMICONDUCTOR FIELD-EFFECT TRANSISTOR) LOGICAL CIRCUIT HAVING DEPLETION TYPE LOAD TRANSISTOR

[75] Inventor: Yoshikazu Hatsukano, Kodaira, Japan

[73] Assignee: Hitachi, Ltd., Japan

[22] Filed: May 29, 1975

[21] Appl. No.: 581,775

Related U.S. Application Data

[62] Division of Ser. No. 381,485, July 23, 1973, Pat. No. 3,917,958.

[30] Foreign Application Priority Data

Aug. 25, 1972 Japan .............................. 47-84565

[52] U.S. Cl. .......................... 307/221 C; 307/205; 307/215; 307/218; 307/224 C
[51] Int. Cl.² ................. G11C 19/28; H03K 23/22; H03K 19/08; H03K 19/20
[58] Field of Search ............ 307/205, 221 C, 224 C, 307/251, 269

[56] References Cited
UNITED STATES PATENTS 3,526,783   9/1970   Booher ............................ 307/205
3,567,968   3/1971   Booher ........................ 307/205 X
3,700,981   10/1972  Masuhara et al. .............. 307/205 X

OTHER PUBLICATIONS

Lohman, "Applications of MOSFETS in Microelectronics"; SCP and Solid State Technology, 3/1966; pp. 23-29.

Primary Examiner—John S. Heyman
Assistant Examiner—Larry N. Anagnos
Attorney, Agent, or Firm—Craig & Antonelli

[57] ABSTRACT

In a logic circuit having a load MISFET of the depletion type, a MISFET logic circuit employs a logic block of a predetermined logic expression, and a MISFET of the enhancement type. The depletion type MISFET, the logic block and the enhancement type MISFET are connected in series. The enhancement type MISFET is driven by clock pulses so that, only when it is conductive, current flows through the series circuit. Thus, the amount of power consumption is lowered.

2 Claims, 5 Drawing Figures

MISFET (METAL-INSULATOR-SEMICONDUCTOR FIELD-EFFECT TRANSISTOR) LOGICAL CIRCUIT HAVING DEPLETION TYPE LOAD TRANSISTOR

This is a division of application Ser. No. 381,485, filed July 23, 1973, now U.S. Pat. No. 3,917,958.

BACKGROUND OF THE INVENTION

1. Field of the Invention

The present invention relates to a logic circuit composed of insulated gate field-effect transistors (hereinbelow termed "MISFETs"). More particularly, it relates to a MISFET logic circuit having a depletion type load transistor.

2. Description of the Prior Art

As the general logic circuit employing MISFETs, the so-called EE (enhancement-enhancement) system is known in which both MISFETs for a load and for drive are of the enhancement type. As means to reduce the power consumption of the above system, there is the clock drive system in which the load transistor is driven by clock pulses.

On the other hand, with the so-called ED (enhancement-depletion) system employing a depletion type MISFET as a load transistor, it is difficult to adopt the clock drive system similar to that of the EE system. Nevertheless, excellent properties such as low power consumption, high speed and high degree of integration are available due to the possibility of a low supply voltage and the constant current characteristic of the depletion type MISFET.

FIG. 5 shows the fundamental circuit of a logic circuit according to the ED system.

To be noted in regard to the fundamental circuit in the figure is the fact that, whenever drive transistor $Q_d$ is conductive, current flows through a series circuit consisting of the drive transistor $Q_d$ and load transistor $Q_1$.

SUMMARY OF THE INVENTION

It is, accordingly, an object of the present invention to reduce the average quantity of current which flows through the series circuit, to thereby further lower the power consumption of a logic circuit according to the ED system.

Another object of the present invention is to provide a MISFET logic circuit having a depletion type load transistor, which circuit can be brought into a low power consumption without significantly increasing the number of transistors.

The present invention itself and the other objects of the present invention will become apparent from the following detailed description when taken with reference to the accompanying drawings.

BRIEF DESCRIPTION OF THE DRAWINGS

FIG. 5 is a prior-art MISFET logic circuit employing a depletion type load transistor, which circuit has already been referred to.

PREFERRED EMBODIMENTS OF THE INVENTION

Figure 1:
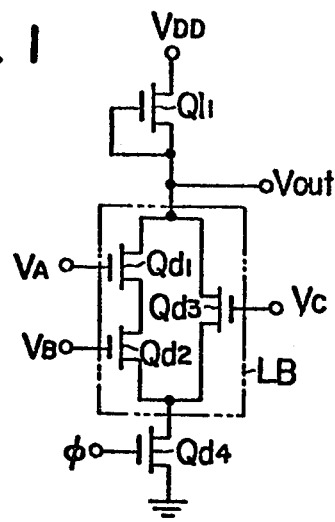
FIGS. 1 to 3 are connection diagrams of MISFET logic circuits employing depletion type load transistors arranged in accordance with the present invention.

FIG. 1 shows a MISFET logic circuit according to the present invention.

In the figure, $Q_{11}$ designates a MISFET of the depletion type by which, even when no bias voltage is applied between the gate and the source, current flows between the source and the drain. The depletion type MISFET $Q_{11}$ is used as a load transistor. On the other hand, $Q_{d1} - Q_{d3}$ indicate MISFETs of the enhancement type by which, when a prescribed bias voltage is applied between the gate and the source, current will begin to flow between the source and the drain. The enhancement type MISFETs are used as drive transistors.

In order to provide a good constant current characteristic, the gate electrode of the MISFET $Q_{11}$ is connected to the source electrode thereof, namely, the output terminal of the logic circuit.

The MISFETs $Q_{d1} - Q_{d3}$ constitute a logic block LB which satisfies the logic expression $V_{out} = \overline{(V_A + V_B) \cdot V_C}$ (when the conductivity type of the channel of each MISFET is P-type and when positive logic is adopted).

A MISFET $Q_{d4}$ is further provided by the present invention. It has clock pulses $\phi$ applied to the gate electrode and is, thus, clock-driven. The pulse width of the clock pulse $\phi$ is made smaller than the pulse width of each of the input signals $V_A - V_C$.

The MISFETs $Q_{11}$ and $Q_{d4}$ and the logic block LB are connected in series. The output signal $V_{out}$ is derived from the connection between the logic block LB and the load MISFET $Q_{11}$. According to the present invention, however, it is also possible to connect the transistor $Q_{d4}$ between the load MISFET $Q_{11}$ and the logic block LB, and to derive the output signal from the drain electrode of the transistor $Q_{d4}$.

With the MISFET logic circuit thus constructed, only when the MISFET $Q_{d4}$ is rendered conductive by the clock pulse $\phi$, will current flow through the closed series circuit consisting of the MISFETs $Q_{11}$ and $Q_{d4}$ and the logic block LB. It is, therefore, possible to reduce the power consumption. The value of the output signal $V_{out}$ is determined by the values of the input signals $V_A - V_C$ during the conduction period of MISFET $Q_{d4}$. That is, the relation $V_{out} = \overline{(V_A + V_B) \cdot V_C}$ holds during the conduction period.

With the MISFET logic circuit according to the present invention, the number of transistors which are serially connected between the output terminal and a ground terminal is increased by one in comparison with the number of the same in a circuit of the EE system. However, the area occupied by the elements does not become larger, but it becomes smaller under some conditions.

The reason is that, with the EE system, the number of transistors to be connected in series from the output terminal is limited to at most two, whereas with the ED system, about four transistors can be connected in series from the output terminal under the condition of obtaining the same output level at the same operating speed.

A quantitative explanation of the reason will be omitted for brevity. In short, it is with the ED system that the connection of the current limiting MISFET in series with the logic block LB can be readily accomplished.

Figure 2:
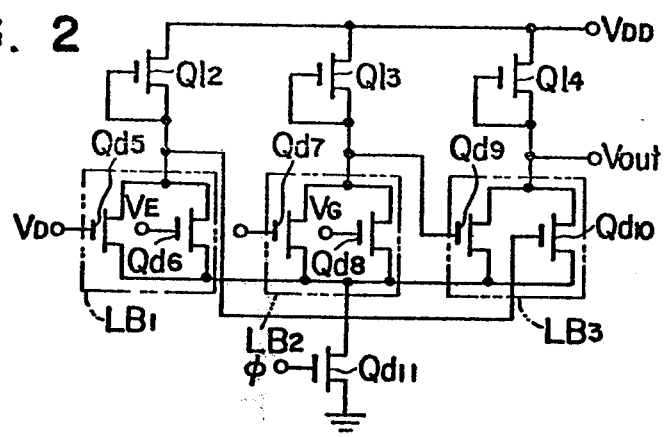

FIG. 2 shows another embodiment according to the present invention, which is an AND - OR circuit often required in a digital control circuit, etc.

In the figure, $Q_{d5} - Q_{d10}$ indicate enhancement type MISFETs. With a respective pair of the transistors forming each set, logic blocks $LB_1 - LB_3$ are constructed. Depletion type load MISFETs $Q_{12} - Q_{14}$ are connected to the respective logic blocks. Each of the logic blocks $LB_1 - LB_3$ is so arranged as to have the function of a two-input NAND circuit. Output signals derived from the logic blocks $LB_1$ and $LB_2$ are utilized as input signals of the logic block $LB_3$. It will be understood that output signal $V_{out}$ is, accordingly, represented by the logic expression: $V_{out} = \overline{(\overline{V_D \cdot V_E}) \cdot (\overline{V_F \cdot V_G})} = V_D \cdot V_E + V_F \cdot V_G$.

The feature of the AND - OR circuit lies in that a single MISFET $Q_{d11}$ is connected commonly in series to the respective logic blocks, whereby the current flowing through the three logic blocks is limited by the single transistor $Q_{d11}$. Even with such an arrangement, the actual logic is similarly determined during the period of the width of the clock pulse $\phi$ applied to the transistor $Q_{d11}$.

In this manner, according to this embodiment, a single MISFET may be provided for an aggregate of logic blocks. The embodiment therefore attains the object of reducing the power consumption, and is advantageous in being capable of increasing the degree of integration. The single MISFET must usually absorb the total amount of current flowing through the logic blocks belonging to the aggregate to which the MISFET is connected. In consequence, it must be a MISFET larger (lower in resistance) than the transistors constituting the logic blocks. Of course, in addition to the form of the single MISFET, the current limiting MISFET may take the form of a plurality of MISFETs connected in parallel. Since the logic is not dynamic, using a four-phase clock, the embodiment also has the feature that the current limiting MISFET may be arranged at a place convenient for layout.

Figure 3:
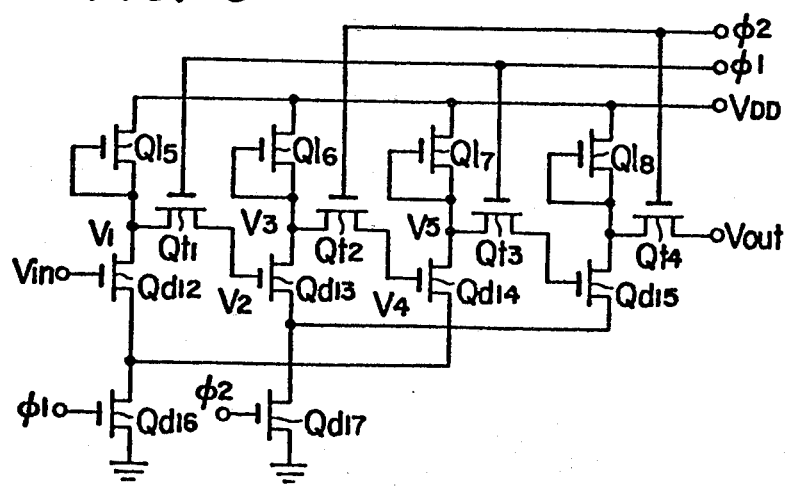

FIG. 3 shows still another embodiment of the present invention, which is a two-phase dynamic shift register of two bits.

Figure 4:
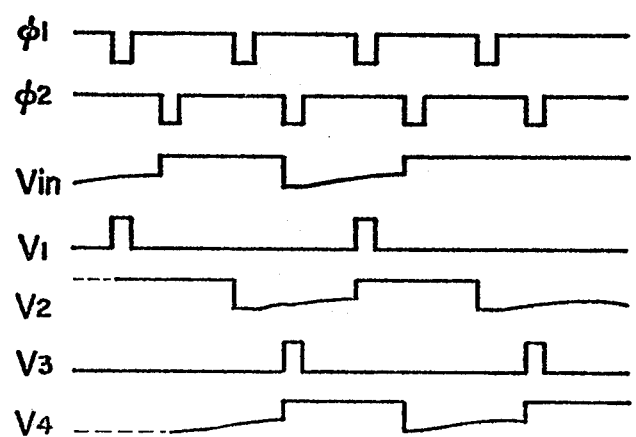
FIG. 4 is a time chart for explaining the operation of the shift register in FIG. 3.
Figure 5:
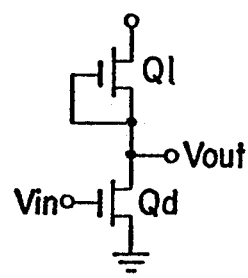

In the figure, enhancement type MISFETs $Q_{d12} - Q_{d15}$ are connected to depletion type load MISFETs $Q_{15} - Q_{18}$, respectively. An enhancement type MISFET for current limitation $Q_{d16}$ is connected commonly in series to the MISFETs $Q_{d12}$ and $Q_{d14}$; and its gate electrode is applied with clock pulses $\phi_1$ as shown in FIG. 4, A MISFET $Q_{d17}$ is connected commonly in series to the MISFETs $Q_{d13}$ and $Q_{d15}$, and its gate electrode is applied with clock pulses $\phi_2$ (FIG. 4) which differ in phase from the clock pulses $\phi_1$.

The MISFETs $Q_{15}$, $Q_{d12}$ and $Q_{d16}$ constitute an inverter circuit. Similarly, the other MISFETs (including $Q_{d16}$) constitute three inverter circuits. The respective inverter circuits are connected in cascade through enhancement type MISFETs for transfer $Q_{t1} - Q_{t3}$. From the inverter circuit at the final stage, an output signal is derived through a MISFET $Q_{t4}$. The gate electrodes of the MISFETs $Q_{t1}$ and $Q_{t3}$ are applied with the clock pulses $\phi_1$, while the gate electrodes of the MISFETs $Q_{t2}$ and $Q_{t4}$ are applied with the clock pulses $\phi_2$. The gate electrode of the MISFET $Q_{d12}$ is applied with an input signal $V_{in}$ (FIG. 4) which is synchronized with the clock pulses $\phi_2$.

The operation of the shift register thus constructed will now be described with reference to the time chart in FIG. 4. In the figure, the upper level indicates a logical "1" (ground potential), and the lower level a logical "0" (a negative potential).

When the clock pulse $\phi_1$ becomes "0" to render the MISFET $Q_{d16}$ conductive, an outut signal of the first inverter circuit or the source potential $V_1$ of the MISFET $Q_{15}$ becomes the inverted signal $\overline{V_{in}}$ of the input signal $V_{in}$. Since the transfer MISFET $Q_{t1}$ is also conductive at this time, the output signal $V_1$ is fed through the MISFET $Q_{t1}$ to the MISFET $Q_{d13}$, and is stored by the gate capacitance of the MISFET $Q_{d13}$. Similarly, when the clock pulse $\phi_2$ becomes "0" to render the MISFETs $Q_{d17}$ and $Q_{t2}$ conductive, the inverted signal of the signal stored in the MISFET $Q_{d13}$ is written into the gate capacitance of the MISFET $Q_{d14}$. Accordingly, the gate potential $V_2$ of the MISFET $Q_{d13}$ becomes equal to a signal with the inverted signal of the input signal $V_{in}$ delayed by the phase difference between the clock pulses $\phi_1$ and $\phi_2$, as the gate potential $V_2$ is synchronized with the clock pulse $\phi_1$ and the input signal $V_{in}$ is synchronized with the clock pulse $\phi_2$. Since the periods of the clock pulses $\phi_1$ and $\phi_2$ are equal, the gate potential $V_4$ of the MISFET $Q_{d14}$ ultimately becomes equal to a signal with the input signal $V_{in}$ delayed by one period (one bit) of the clock pulses $\phi_1$ or $\phi_2$. This is also apparent from the time chart in FIG. 4.

As illustrated in FIG. 4, the output potential $V_1$ of the first inverter is forced to the value "0" irrespective of the input signal when the clock pulse $\phi_1$ is held at "1". Only when the clock pulse $\phi_1$ falls to "0", is the output potential $V_1$ transferred through the MISFET $Q_{t1}$ to the MISFET $Q_{d13}$ and written thereinto. The gate potential $V_2$ therefore sustains only the correct value of the output potential $V_1$ until the clock pulse $\phi_1$ subsequently changes to "1". For a similar reason, the period during which the output potential $V_1$ exhibits the correct value becomes equal to the pulse width of the clock pulse $\phi_1$, and is shorter than such period of the input signal $V_{in}$. However, this causes no problem since the period during which the gate potential $V_2$ exhibits the correct value becomes equal to the period of the clock pulses $\phi_1$.

In this manner, the period during which the output signal derived from each logic block indicates the correct value is made short with respect to the pulse width of the clock pulse. When it must be corrected, the logic circuit in FIG. 1, for example, may be operated such that the signal is fed from the logic block LB to the next stage of the circuit through the transfer MISFET which is triggered by the clock pulse $\phi$.

The shift register described above has the following advantages, which will be easily understood from the explanation of the embodiments in FIGS. 1 and 2:
1. The power consumption is lowered; and
2. The number of transistors for lowering the power consumption can be made smaller than the number of logic blocks.

What I claim is:
1. A MISFET logic circuit comprising:
   at least one stage having
   a first MISFET having a source, a gate, and a drain electrode;
   a depletion type second MISFET having a source, a gate, and a drain electrode;
   a logic circuit to which prescribed logic signals are coupled; and wherein
   said first MISFET, said depletion type second MISFET, and said logic circuit are connected together in series, with said second MISFET forming a load and with said first MISFET being coupled to receive clock pulses, for driving said circuit, at the gate electrode thereof;

wherein said MISFET logic circuit comprises a plurality of stages connected in cascade to form a shift register circuit, with the respective gate electrodes of the first MISFETs, for controlling the operation of a respective stage receiving clock pulses shifted in time with respect to each other.

2. A MISFET shift register comprising:

a plurality of stages connected in cascade, each stage comprising:

a depletion type load MISFET having a source, a gate and a drain electrode, the drain electrode of which being connected in common with the drain electrodes of the depletion type load MISFETs of each stage to a first source of reference potential, with the source and gate electrodes connected together;

an input enhancement type MISFET having a source, a gate, and a drain electrode, the drain electrode of which is connected to the source of said depletion type load MISFET, and the gate electrode of which is coupled to receive an input signal;

a switching enhancement type MISFET having a source, a gate and a drain electrode, the source electrode of which is connected to the drain electrode of said input MISFET, the gate electrode of which is coupled to receive a prescribed clock signal, and the drain electrode of which provides the output of that respective stage; and wherein the output of a respective stage is connected to the gate electrode of the input MISFET of the next succeeding stage; and a multiplicity of enhancement type MISFETs each having a source, a gate, and a drain electrode, the drain electrodes of which are connected to the source electrodes of the input MISFETs of alternately adjacent stages, the source electrodes of which are connected to a second source of reference potential, and the gate electrodes of which are connected to receive said prescribed clock signal, but shifted in time with respect to the clock signal applied to an adjacent stage.

* * * * *